United States Patent
Tangyunyong et al.

(10) Patent No.: US 10,094,874 B1
(45) Date of Patent: Oct. 9, 2018

(54) SCANNING METHOD FOR SCREENING OF ELECTRONIC DEVICES

(71) Applicant: Sandia Corporation, Albuquerque, NM (US)

(72) Inventors: Paiboon Tangyunyong, Albuquerque, NM (US); Edward I. Cole, Jr., Albuquerque, NM (US); Guillermo M. Loubriel, Albuquerque, NM (US); Joshua Beutler, Albuquerque, NM (US)

(73) Assignee: National Technology & Engineering Solutions of Sandia, LLC, Albuquerque, NM (US)

(*) Notice: Subject to any disclaimer, the term of this patent is extended or adjusted under 35 U.S.C. 154(b) by 322 days.

(21) Appl. No.: 15/208,931

(22) Filed: Jul. 13, 2016

Related U.S. Application Data (63) Continuation-in-part of application No. 14/882,710, filed on Oct. 14, 2015, which is a continuation-in-part of application No. 13/309,281, filed on Dec. 1, 2011, now Pat. No. 9,188,622.

(51) Int. Cl.
| | |
|---|---|
| *G01R 31/307* | (2006.01) |
| *G01R 27/28* | (2006.01) |
| *G01R 31/303* | (2006.01) |
| *G01R 31/311* | (2006.01) |

(52) U.S. Cl.
CPC ........... *G01R 31/307* (2013.01); *G01R 27/28* (2013.01); *G01R 31/303* (2013.01); *G01R 31/311* (2013.01)

(58) Field of Classification Search
CPC .. G01R 31/307; G01R 31/303; G01R 31/311; G01R 27/28
USPC ...................................... 324/754.22
See application file for complete search history.

(56) References Cited

U.S. PATENT DOCUMENTS

| | | | |
|---|---|---|---|
| 5,430,305 A | 7/1995 | Edward et al. | |
| 5,949,798 A | 9/1999 | Sakaguchi | |
| 5,991,697 A * | 11/1999 | Nelson | G01P 5/26 356/28.5 |
| 6,058,502 A | 5/2000 | Sakaguchi | |
| 6,078,183 A | 6/2000 | Edward | |
| 6,549,022 B1 | 4/2003 | Edward et al. | |

(Continued)

OTHER PUBLICATIONS

Carson, et al., "Algorithm Explorer: Visualizing Algorithms in a 3D Multimedia Environment", ACM SIGCSE, vol. 39, No. 1, Mar. 7, 2007, 5 pages.

(Continued)

*Primary Examiner* — Jeff Natalini
(74) *Attorney, Agent, or Firm* — Martin I. Finston (57) ABSTRACT

A visualization method for screening electronic devices is provided. In accordance with the disclosed method, a probe is applied to a grid of multiple points on the circuit, and an output produced by the circuit in response to the stimulus waveform is monitored for each of multiple grid points where the probe is applied. A power spectrum analysis (PSA) produces a power spectrum amplitude, in each of one or more frequency bins, on the monitored output for each of the multiple grid points. The PSA provides a respective pixel value for each of the multiple grid points. An image is displayed, in which image portions representing the multiple grid points are displayed with the respective pixel values.

20 Claims, 10 Drawing Sheets

(56) References Cited

U.S. PATENT DOCUMENTS

| | | | | |
|---|---|---|---|---|
| 6,549,801 | B1* | 4/2003 | Chen | A61B 5/0073 |
| | | | | 250/350 |
| 6,600,333 | B1 | 7/2003 | Martin et al. | |
| 6,671,153 | B1 | 12/2003 | Ker et al. | |
| 7,385,686 | B2* | 6/2008 | Shiba | G01R 31/308 |
| | | | | 356/237.1 |
| 9,304,160 | B1* | 4/2016 | Jensen | G01R 31/2601 |
| 2001/0043079 | A1 | 11/2001 | Sakaguchi | |
| 2003/0016044 | A1 | 1/2003 | Ishida et al. | |
| 2009/0119042 | A1* | 5/2009 | Meng | G01R 31/311 |
| | | | | 702/66 |
| 2011/0012613 | A1* | 1/2011 | Gong | G01R 31/307 |
| | | | | 324/543 |
| 2011/0291692 | A1* | 12/2011 | Ando | H01J 37/20 |
| | | | | 324/762.01 |
| 2016/0370425 | A1* | 12/2016 | Stallcup | G01R 1/30 |

OTHER PUBLICATIONS

Malloy, et al, "Exploiting UML Dynamic Object Modeling for the Visualization of C++ Programs", Proceedings of the 2005 ACM Symposium on Software Visualization, ACM, 2005, pp. 105-114.

Shah, et al, "Visualization of Exception Handling Constructs to Support Program Understanding", Proceedings of the 4th ACM Symposium on Software Visualization, ACM, Sep. 16, 2008, pp. 19-28.

Maletic, et al., "MosaiCode: Visualizing Large Scale Software a Tool Demonstration", 2011 6th IEEE International Conference on Visualizing Software for Understanding and Analysis, 2011, 4 pages.

Davies, et al., "Back to basics: the principles of principal component analysis", 2004, Spectroscopy Europe, pp. 20-23.

Smith, L. I., A tutorial on Principal Components Analysis, 2002.

Jeong, D. H. et al., "Understanding Principal Component Analysis Using a Visual Analytics Tool", 2009, Charlotte Visualization Center, UNC Charlotte.

Ng, Y. S. et al., "Laser Voltage Imaging: A New Perspective of Laser Voltage Probing", 2010, Proceedings from the 36th International Symposium for Testing and Failure Analysis, Addison, TX.

Shaneyfelt, M. R. "Identificatio of Radiation-Induced Parasitic Leakage Paths Using Light Emission Microscopy", 2004, IEEE Transactions on Nuclear Science, p. 2782-2786, vol. 51.

Cole, E. I. "Novel Failure Analysis Techniques Using Photon Probing With a Scanning Optical Microscope", 1994, IEEE Reliability Physics Symposium, pp. 388-398.

Cole, E. I. "TIVA and SEI Developments for Enhanced Front and Backside Interconnection Failure Analysis", 1999, Microelectronics Reliabiliy, pp. 991-996, vol. 39.

* cited by examiner

SCANNING METHOD FOR SCREENING OF ELECTRONIC DEVICES

CROSS-REFERENCE TO RELATED APPLICATIONS

This application is a continuation-in-part of U.S. patent application Ser. No. 14/882,710, which is a continuation-in-part of U.S. patent application Ser. No. 13/309,281. Application Ser. No. 14/882,710, which is commonly owned herewith, was filed on Oct. 14, 2015 by P. Tangyunyong et al. under the title "Defect Screening Method for Electronic Circuits and Circuit Components Using Power Spectrum Analysis". The entirety thereof is hereby incorporated herein by reference. Application Ser. No. 13/309,281, which is commonly owned herewith, was filed on Dec. 1, 2011 by P. Tangyunyong under the title "Power Spectrum Analysis for Defect Screening in Integrated Circuit Devices" and issued on Nov. 17, 2015 as U.S. Pat. No. 9,188,622. The entirety thereof is hereby incorporated herein by reference.

FEDERALLY SPONSORED RESEARCH

The United States Government has rights in this invention pursuant to Department of Energy Contract No. DE-AC04-94AL85000 with Sandia Corporation.

FIELD OF THE INVENTION

The invention relates to testing of electronic circuits and devices.

ART BACKGROUND

The testing of electronic devices, including discrete components as well as integrated circuits and assemblies such as circuit boards, is important for various reasons. Testing of devices on the wafer can be useful for process verification and control, among other things. Testing of manufactured or partially manufactured devices is important for detecting defects, as well as for purposes such as confirming the provenance of the devices.

Defect detection in integrated circuits (ICs), for example, can be challenging because an IC can have millions of transistors with a feature size less than a micrometer. Therefore, to identify a defect in an IC generally requires extensive failure analysis. In the past, various techniques based on electrical, optical, and thermal properties of ICs have been developed. However, these techniques are quite complex, time-consuming, and costly.

Further, an IC or other circuit component can contain a latent defect (also referred to as a "failure precursor") that is likely to develop into a defect after a period of use. Conventionally, these latent defects are detected by subjecting the IC or component to reliability testing, during which the device receives high voltage and/or high temperature for a period of time. Reliability testing can be quite time-consuming and can significantly increase the production cost.

Various screening techniques are available for detecting defects or other anomalies in ICs and other circuit components. However, the selection of any screening technique involves tradeoffs among cost, accuracy, discrimination among different anomalies, destructiveness, and other factors. Hence there remains a need for a greater variety of screening techniques, and in particular for techniques that are simple and efficient.

SUMMARY OF THE INVENTION

We have developed a new method for visualizing the spatial distribution of anomalies in devices under test using power spectrum analysis (PSA). Our method can be used to identify the physical locations in a device under test (DUT) that give rise to observable differences in the response of the DUT to PSA stimuli, relative to a standard, expected, or nominal response. These differences can be used, for example, to separate devices believed to be "good", i.e. properly functioning, from devices suspected to be damaged, or to separate devices believed to be genuine from devices suspected to be counterfeit. The ability to identify specific physical locations as sources of anomalous response will enhance the effectiveness of PSA screening for these and other purposes. In practice, an appropriate disposition can be made of each inspected device based, at least in part, on the spatially resolved information that is obtained.

As explained below, our method encompasses at least two complementary approaches. In one approach, spatially resolved PSA amplitudes at specific frequencies are displayed in an image as pixel values or the like. In another approach, principal component analysis (PCA) is used to concisely characterize an entire PSA spectrum, taken at each of a plurality of grid points, as a composite of several principal component values. In that approach, the respective composite principal component values are displayed in an image as pixel values (e.g., color values) or the like.

Our method is applicable at various scales of complexity, from discrete components to large ICs and even to assembled circuit boards.

Accordingly, the invention in one aspect involves operations of applying a stimulus waveform at least between two pins of a circuit; applying a probe to a grid of multiple points on the circuit; and monitoring an output produced by the circuit in response to the stimulus waveform for each of multiple grid points where the probe is applied. The probe may in some cases be an energetic beam such as a laser beam, which induces physical changes in the DUT. In other cases, the probe may be a sensor that senses a response to the PSA stimulus without inducing substantial changes in the DUT.

It should be understood in this regard that a "waveform" may be periodic or non-periodic. An example of a periodic waveform is a sinusoid or a square or triangular wave, or a cyclically repeated test vector. An example of a non-periodic waveform is a test vector that is not repeated, or a pseudorandom sequence of binary or non-binary values.

It should be further understood that although we have referred to a grid of multiple "points", it will be typical in practice for the probe to interact with a finite area, i.e. a spot, on the circuit. Hence the term "grid points" or the like should be understood as encompassing spots arranged in a grid-like pattern. In examples, each grid point corresponds to a pixel of an image to be generated. In examples, the area of interaction with the probe is approximately the size of a single pixel.

The invention further involves performing a power spectrum analysis (PSA), on the monitored output for each of the multiple grid points. The PSA is performed so as to produce a power spectrum amplitude in each of one or more frequency bins. The terms "power spectrum analysis" and "PSA" as used herein refer to the computation of power spectrum amplitudes in any number of frequency bins, which may be as few as a single bin or as many as hundreds or thousands of bins or even greater numbers.

In embodiments, the invention further involves deriving a respective pixel value from the PSA for each of the multiple grid points; and displaying an image in which image portions representing the multiple grid points are displayed with the respective pixel values. In examples, the displayed image is a two-dimensional representation, e.g. a plan view, in which the pixel values are mapped one-to-one to respective portions of the image. In other examples, the pixel values are processed to generate a three-dimensional representation in which some of the information from the pixel values is displayed as height.

In embodiments, the probe is a beam of electromagnetic radiation such as a laser beam, or it is an electron or ion beam.

In embodiments, a frequency bin is selected for the PSA, and the respective pixel values are derived from power-spectrum amplitudes in the selected frequency bin.

In embodiments, the respective pixel value for each of the multiple grid points is derived from a power-spectrum amplitude produced in each of one or more frequency bins by the PSA; and each of the power-spectrum amplitudes is normalized before it is used to derive a respective pixel value. The normalization of the power-spectrum amplitudes is performed relative to power-spectrum amplitudes obtained from a response of the circuit to the stimulus waveform absent the probe.

In embodiments, the PSA is performed over a plurality of frequency bins at each of the multiple grid points. This is done so as to produce a vector of power spectrum amplitudes at each grid point. A principal component analysis (PCA) is performed on the vectors. Each vector is mapped to an n-tuple of principal component weights, wherein n equals 1, 2, 3, or 4, and the respective pixel values are derived from the n-tuples. For example, for n=1 the pixel values could be displayed as grey-scale values, for n=3 they could be displayed as color values, and for n=4 they could be displayed as a combination of color values and height values in a three-dimensional plot.

Thus, in an illustrative example, a 10×10 grid has 100 grid points. A PSA spectrum is taken at each of the 100 grid points. The PCA is performed on each of the 100 spectra that are obtained, so as to produce 100 sets of principal components (i.e., one set for each grid point). Each of the 100 sets of principal components is then mapped to a composite color value for plotting in a respective pixel area of an image.

Generally, the vectors of power spectrum amplitudes will be normalized prior to the PCA. In examples, the normalization is relative to a response of the circuit to the stimulus waveform absent the probe. In other examples, the normalization is relative to the response of a reference circuit.

In some embodiments, the n principal components are selected to maximally account for variability in the normalized vectors over the multiplicity of grid points. In other embodiments, however, one or more of the n principal components may be selected for other reasons, such as sensitivity to variations over groups of circuits that are under test.

DETAILED DESCRIPTION

Power spectrum analysis (PSA) is a technique that indirectly measures the frequency response of a device when the device is subject to a dynamic stimulus. Devices with defects tend to exhibit frequency responses that differ from the frequency responses of healthy devices, i.e. devices that are fully functional and meet all desired manufacturing tolerances.

Conventional techniques of failure analysis are effective only when defects give rise to an observable electrical signature of a failure. However, these signatures, and especially the signatures of latent defects, can be masked by the background electrical signals of normal operation. One advantage of PSA is that it can be more effective than conventional methods in detecting masked indications of failure or other anomalous behavior.

Figure 1:
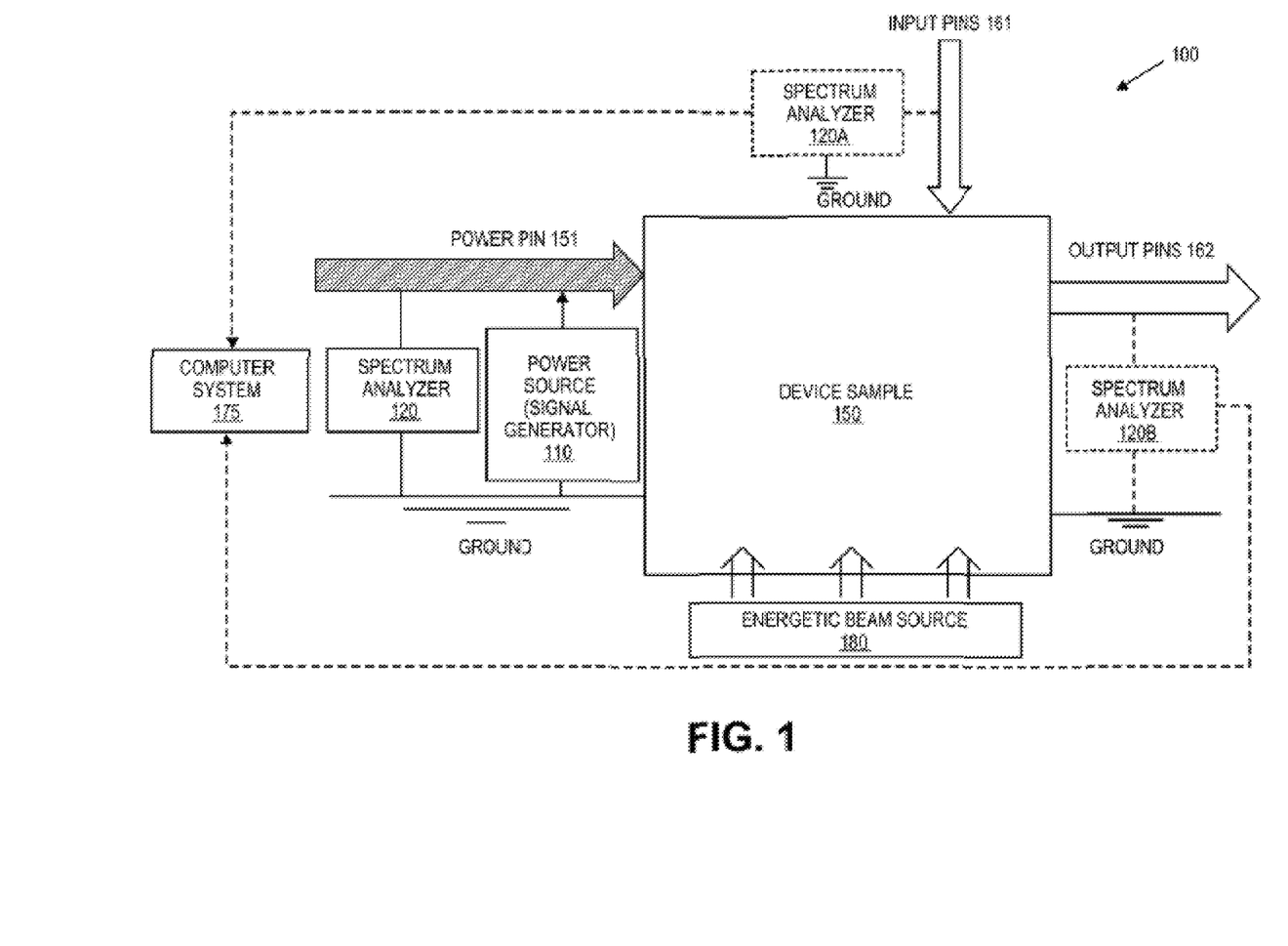
FIG. 1 is a block diagram illustrating an embodiment of a system that measures a power spectrum analysis (PSA) signature for a device sample.

FIG. 1 is a block diagram of an example system 100 for power spectrum analysis (PSA). The system 100 includes a power source 110 coupled between a power pin 151 and the ground of a sample of a device under test (DUT) 150. As shown, signal generator 110 provides a dynamic (i.e., a time-varying) stimulus to DUT 150 through power pin 151 of the device. In the implementation shown in FIG. 1, spectrum analyzer 120 is also coupled between the power pin and the ground of the DUT so that the same dynamic stimulus that feeds into power pin 151 is also provided as input to spectrum analyzer 120.

The dynamic stimulus may be a periodic or non-periodic waveform, and it may take, for example, binary, discrete non-binary, or continuous values. It may be constituted by a controlled voltage or a controlled current. Examples of waveforms that may be used include square waves, sinusoids, triangular waves, and periodic bursts of non-periodic waveforms such as chirped waveforms. Other examples include non-periodic or cyclically periodic test vectors and pseudorandom sequences of binary or discrete non-binary values.

With further reference to FIG. 1, it will be seen that DUT 150 also has input pins 161 (including data inputs, clock inputs pins, test inputs such as JTAG inputs, and any other input pins) and output pins 162. It should be understood that the term "pins" as used herein refers generally to any type of lines, wires, ports, or terminals to be used for input, output, power, and ground, and does not mean or imply that DUT 150 has any particular physical configuration. (Thus without limitation the DUT may be in the form of a wafer, die, package, circuit board, or any of various other configurations.)

During testing, any selection of input pins 161 can be left floating, grounded, biased with a constant voltage, or connected to a signal source, as desired. Those input pins (if any) that are connected to a signal source may be connected to a common signal source or to different signal sources. Any combination of input pins 161 can be set to the same varying voltage as power pin 151.

Input pins 161 may also be biased independently of the power pin 151. Some of the input pins, such as the one or more clock pins, can be biased with a switching voltage (e.g., a square wave) to maintain a known dynamic state. Each of output pins 162 can be left floating, or coupled with a load resistor as specified by the manufacturer.

It will be understood that in the example of FIG. 1, and also in the example of FIG. 2 that is discussed below, the dynamic stimulus is applied between ground and the power pin of the DUT. In other examples, not illustrated in the figures, the dynamic stimulus is applied between ground and a signal input pin of the DUT. In still other examples, the dynamic stimulus is applied between any of various other pairs of pins of the DUT.

It is helpful in this regard to make a distinction between "on-normal" and "off-normal" biasing. (The term "biasing" as used herein includes the application of dynamic stimuli.) Off-normal biasing is a biasing scheme that does not require the DUT to be functional or in a known functional state during the biasing. In one example of off-normal biasing, periodic pulses are applied between a power pin and a ground pin while the other pins are floating or biased (possibly through a load resistor) at constant voltages. In another example of off-normal biasing, is periodic pulses are applied between a power pin and a ground pin while certain specifically selected pins are electrically connected to the power pins and other pins are floating or biased at constant voltages.

On-normal (or simply "normal") biasing, by contrast, is any biasing scheme that requires the DUT to be in a known functional state; this is the type of biasing scheme used in normal electrical testing such as is performed using a conventional circuit tester.

Normal biasing is often performed using input in the form of a complex logical test sequence that is meant to place the DUT in known functional states. The stimuli that we use for off-normal biasing are different. In particular, they do not contain logical information.

Of course any number of different biasing schemes can be used to produce complementary information. For such purposes, the choice of biasing schemes may include both normal biasing and off-normal biasing.

Turning again to FIG. 1, when a dynamic stimulus is applied to power pin 151 of DUT 150, spectrum analyzer 120 measures its electrical response (which is a time-varying voltage signal). Specifically, spectrum analyzer 120 measures the response on power pin 151, calculates the real-time Fast Fourier Transform (FFT) of the response, and displays the frequency components (i.e., the power spectrum) of the response. The display shows the amplitude of each frequency component. The amplitude can be shown in decibels (in log scale) such that non-dominant frequency components can be visible on the display. The power spectrum is a PSA signature of device sample 150.

In alternative embodiments, spectrum analyzer 120 can be connected to any of input pins 161 (including the one or more clock pins) or any of output pins 162 to measure the response of device sample 150 to the dynamic stimulus provided through power pin 151. These alternative placements of spectrum analyzer 120 are shown in FIG. 1 as spectrum analyzer 120A and spectrum analyzer 120B in dotted text boxes, and their connections to other components are shown in dotted lines. Each of these alternative placements of spectrum analyzer 120, 120A and 120B can produce the same or different PSA signatures of device sample 150 for screening purposes.

Figure 2:
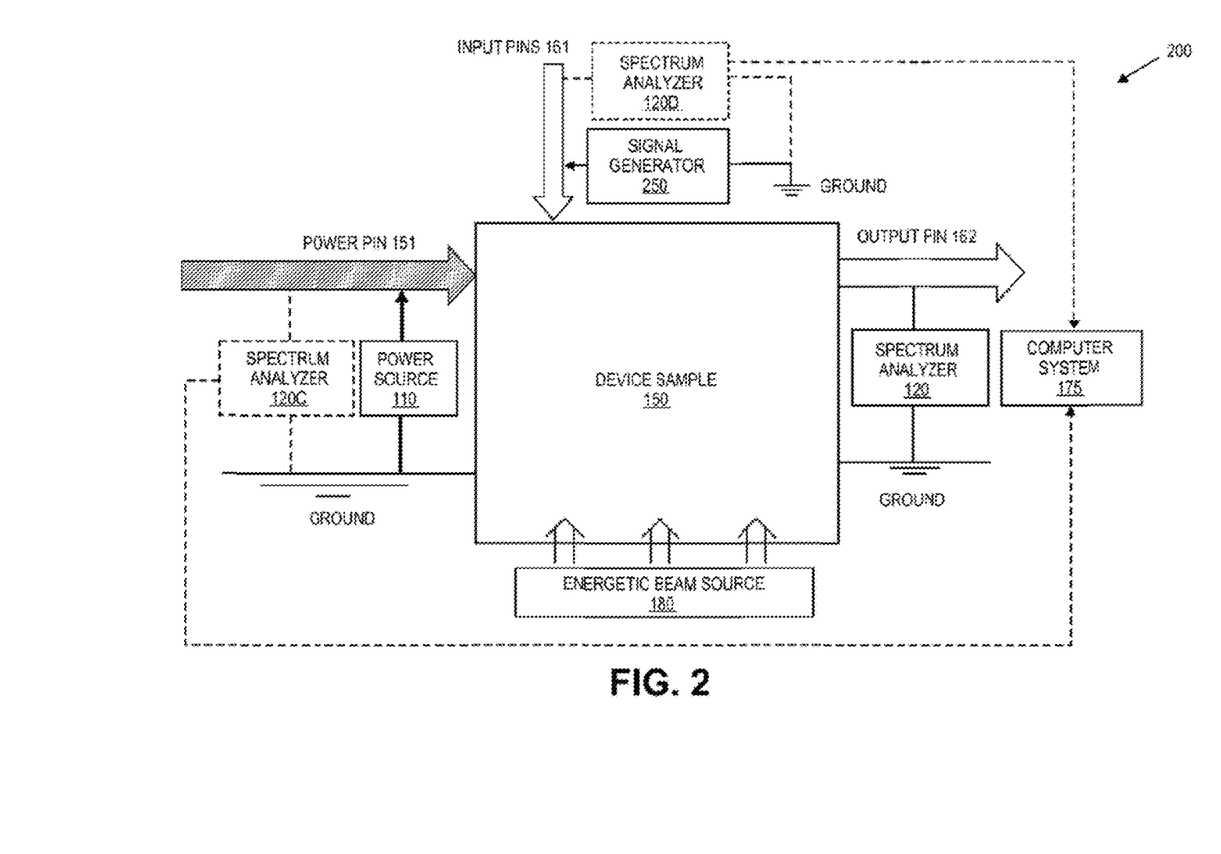
FIG. 2 is a block diagram illustrating another embodiment of a system that measures a PSA signature for a device sample.

FIG. 2 is a block diagram illustrating a second implementation in which a system 200 is used for PSA screening. Here, the dynamic stimulus is provided to DUT 150 through at least one of input pins 161. Power source 110 provides voltage, normally constant voltage, to power pin 151, and at least one input pin 161 receives a dynamic stimulus from signal generator 250. The remaining input pins 161 can be either floating, biased with a constant voltage, or biased with a switching voltage to maintain a known dynamic biasing state.

In some implementations, signal generator 250 is a vector generator that is coupled to multiple input pins 161 to supply the dynamic stimulus in the form of a sequence of test vectors (with each test vector being, e.g., a vector of logical lows and highs). These test vectors can also be used for functional testing of DUT 150; that is, the test vectors can also be used to verify whether DUT 150 produces outputs in response to inputs as required by its manufacturer's specification.

As shown in FIG. 2, spectrum analyzer 120 can be coupled between any of output pins 162 and the ground to measure the response of device sample 150 to the dynamic stimulus injected into the one or more input pins 161. The measured response is also a PSA signature of device sample 150. In some implementations, the dynamic stimulus can be provided to a combination of power pin 151 and one or more input pins 161, and spectrum analyzer 120 can measure the response via any of output pins 162 to obtain a PSA signature.

In alternative implementations, spectrum analyzer 120 can be connected to power pin 151 or any of input pins 161 to measure the response of device sample 150 to the dynamic stimulus provided through the one or more input pins 161. These alternative placements of spectrum analyzer 120 are shown in FIG. 2 as spectrum analyzer 120C and spectrum analyzer 120D in dotted text boxes, and their connections to other components are shown in dotted lines. Varying the placements of spectrum analyzer 120, 120C and 120D can potentially produce different PSA signatures, thus providing complementary information.

In the implementations shown in FIGS. 1 and 2, spectrum analyzer 120 (or any of spectrum analyzers 120A-D) is connected to a computer system 175. The computer system 175 can be used to make determinations of, for example, defect status by comparing the PSA signatures of DUTs with stored reference signatures corresponding to healthy devices and in some cases to stored reference signatures corresponding to devices known to have defects in one or more classes. The computer system can also be used, in accordance with the present invention, to generate images useful for diagnosis, as will be explained below.

As will be explained below, our new technique also generates an image using correlations between measured output and the respective positions of a scanning probe.

Figure 3:
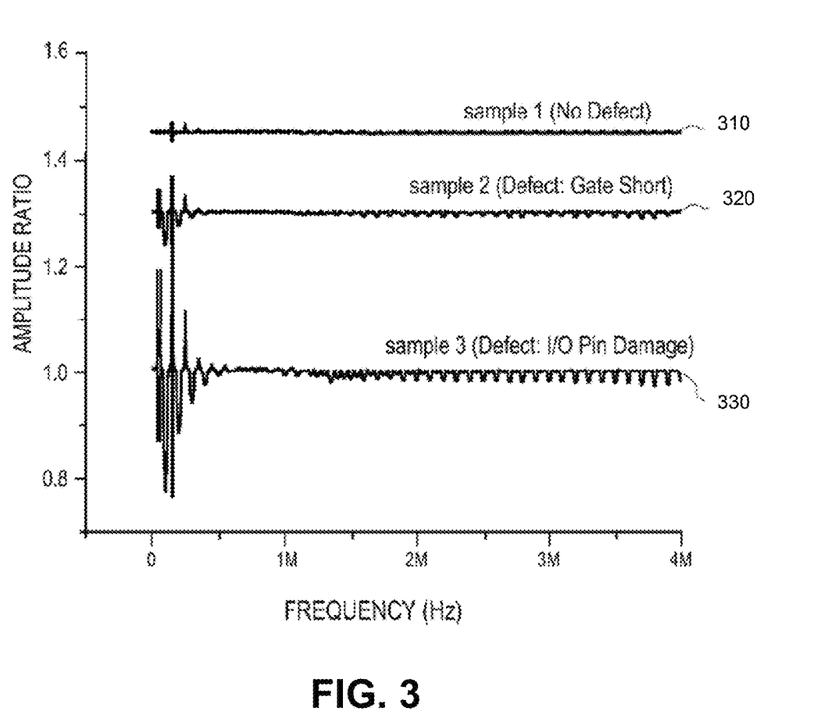
FIG. 3 illustrates examples of three PSA signatures.

FIG. 3 is provided as an illustrative example of several PSA signatures. As seen in the figure, PSA signature 310 is associated with a device sample 1 with no defects, PSA signature 320 is associated with a device sample 2 with a short-circuit defect in gate oxide, and PSA signature 330 is associated with a device sample 3 with I/O pin damage. Each of the PSA signatures 310, 320 and 330 was normalized by dividing the amplitudes in the power spectrum of the device with the corresponding amplitudes in the power spectrum of a reference device known to be free of defects.

In the figure, the amplitudes in the normalized spectra are shown in logarithmic scale. The three curves are vertically offset from each other to facilitate comparison. Differences among the three curves are clearly evident in the figure.

In our new approach, PSA is used to generate physically meaningful values that are mapped to one or more displayable variables. The term "displayable variable" as used here means a visually observable property of an image that can vary over the image. Examples of displayable variables are grayscale value, color, percentage value of a primary additive color component, and height of a portion of a plotted surface above a base plane as viewed in perspective.

In an illustrative example, the physically meaningful value that PSA generates is an amplitude in a selected frequency bin of the power spectrum. The DUT is scanned with a probe. The scan generates a plurality of amplitudes, all in the same selected frequency bin. That is, one such amplitude being generated for each spot in a grid-like pattern of scanned spots.

We refer to the nominal position of each such scanned spot as a "grid point". The amplitude generated at each grid point is mapped to a displayable variable such as grayscale value. The grayscale value is displayed, e.g., as a pixel value in a computer-generated two-dimensional image in which each pixel corresponds to one of the scanned grid points. In the display, the computer-generated image can optionally be superimposed on an image such as an ordinary photographic image, showing the visual appearance of the DUT.

In examples, the probe is an energetic beam that produces a responsive change of some kind in the electrical behavior of the DUT. The energetic beam will typically be a focused beam of light or a laser beam. Although light in the visible spectrum is most convenient, there may be applications for which the use of ultraviolet or infrared light is preferable. In other examples, however, the energetic beam may be an electron beam or ion beam, or an x-ray or gamma-ray beam.

Several diagnostic techniques are already known that provide computer-generated images produced from scans of DUTs. For example, LIVA (Light-Induced Voltage Alteration) and TIVA (Thermally-Induced Voltage Alteration) are known techniques that use image generation as an aid in localizing defects in DUTs. In each of these techniques, the DUT is scanned by a focused beam from a light source. Changes in the electrical properties of the DUT induced by local irradiation are correlated to the positions of the scan beam, and the correlation is used to generate an image of the DUT on which the spatial variation in the induced changes is visible.

LIVA uses a light source with a photon energy near or above the bandgap of the semiconductor material of an integrated circuit under test. The focused beam generates electron-hole pairs in the semiconductor material of the DUT, which in turn affects the electrical behavior of the DUT.

TIVA uses a light source with a photon energy that is less than the bandgap. In TIVA, the scan beam irradiates the electrical conductors within an integrated circuit under test. This causes local heating that affects the electrical behavior of the IC.

In another technique, called Laser Voltage Imaging (LVI), a DUT is stimulated with a repeating test pattern while being scanned with an infrared light beam. The light reflected from the DUT is detected and monitored, and used to generate an image.

Because of the special capabilities of PSA, we expect that our new technique will in many cases be a valuable complement to LIVA, TIVA, LVI, and other known diagnostic methods.

We refer to the use of an energetic beam for PSA imaging as "beam-enhanced PSA". Below, we provide an example of beam-enhanced PSA that uses a laser beam for enhancement. It will be understood that as with LIVA and TIVA, different physical effects can be produced in the semiconductor portions of a DUT depending on whether the laser beam is above or below the bandgap energy of the semiconductor.

An initial step in laser beam-enhanced PSA is to identify sensitive areas in the samples. A sensitive area is an area where laser impingement produces an observable change in the PSA signature that differs between a target sample and a reference sample. Sensitive areas can be discovered by directing the laser spot onto selected portions of the sample while concurrently monitoring changes in the PSA spectrum.

Figure 4:
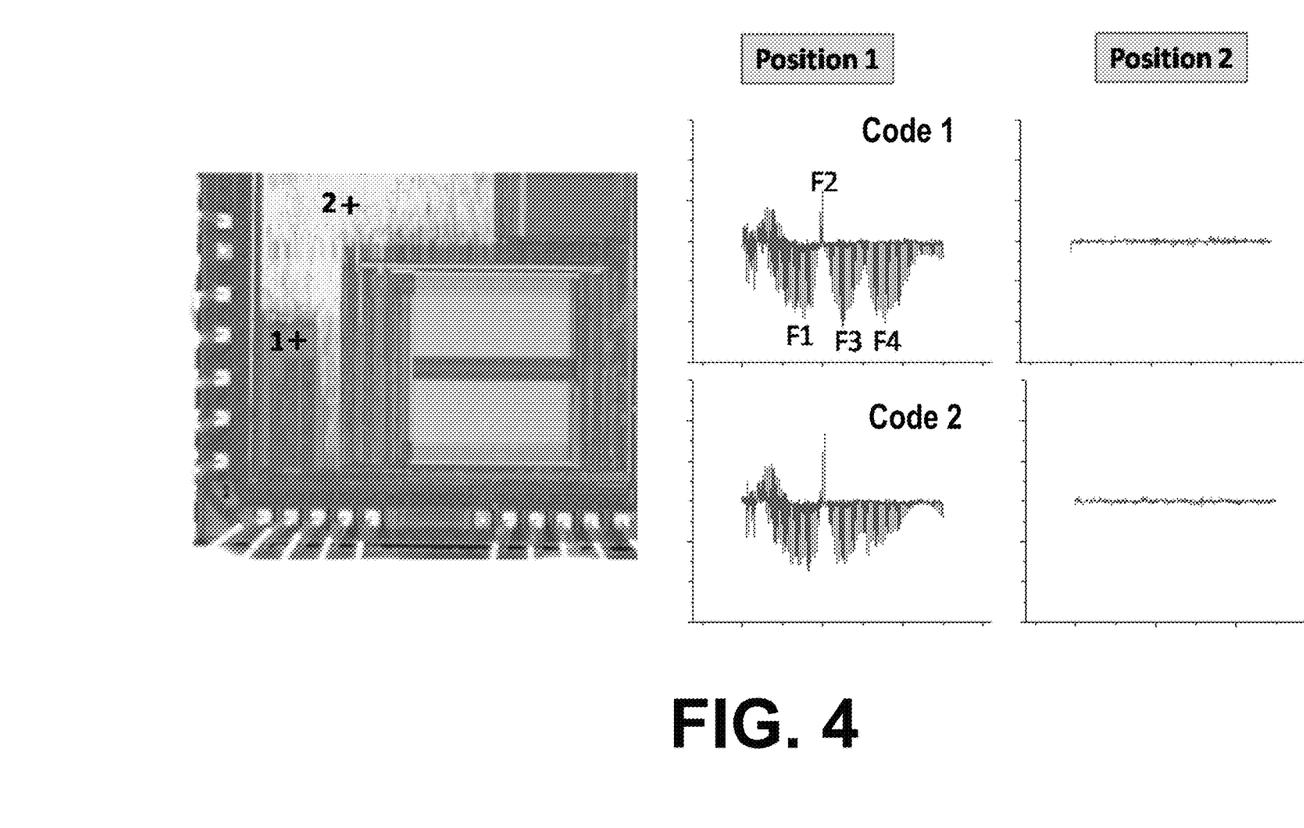
FIG. 4 provides example PSA spectra of a microcontroller having a first date code (upper spectra; "Date Code 1") and a second date code (lower spectra; "Date Code 2"). At left, an optical image of the Code-1 microcontroller is also provided. The spectra were generated at two positions on each microcontroller. Position 1 (the left-hand spectrum of each pair) is seen to produce an observable signal, whereas position 2 (the right-hand spectrum of each pair) is seen to produce no observable signal.

FIG. 4 provides an illustrative example. The left-hand side of the figure is an optical image of a commercially available 32-kB microcontroller having a date code that we refer to here as "Code 1". Two positions are marked in the figure as position 1 and position 2. Four PSA spectra are shown in respective quadrants on the right-hand side of the figure. Each PSA spectrum was normalized by dividing each of the power spectrum amplitudes by the amplitude obtained in the same frequency bin from the DUT without laser stimulation, i.e. from a "dark" PSA spectrum. Hence appearance of an observable feature indicates the occurrence of a spectral change.

The spectrum in the top left quadrant was taken at position 1 of the Code-1 microcontroller. It will be seen that laser stimulation at that position produced large changes in the spectrum. By contrast, the spectrum in the top left quadrant shows that stimulation at position 2 produced no observable changes.

For comparison, PSA spectra were also taken at corresponding positions 1 and 2 on a second microcontroller commercially available from the same manufacturer, but having a different date code that we refer to here as "Code 2". It will be seen from the spectrum in the lower left quadrant that stimulation of the Code-2 microcontroller at position 1 produced changes in the same frequency bins as those produced in the PSA spectrum of the Code-1 microcontroller. These changes are clearly observable but somewhat weaker than those produced in the spectrum of the Code-1 microcontroller. Again, stimulation at position 2 produced no observable changes.

Four main frequency peaks are seen in spectrum in the lower left quadrant, corresponding to laser stimulation at position 1 of the Code-1 microcontroller. These peaks are respectively labeled F1, F2, F3, and F4. Any of these peaks, individually or in combination, are reasonable choices to use for constructing a laser-induced amplitude image. The laser-induced amplitude image is obtained by scanning the laser across the sample while monitoring the changes in the frequency bin corresponding to each of one or more selected frequency peaks.

While the amplitude image is being captured, the reflected light can be concurrently captured to generate an optical image. The optical and laser-induced amplitude images can be superimposed to facilitate visual identification of the areas where responsive differences emerge.

Figure 5:
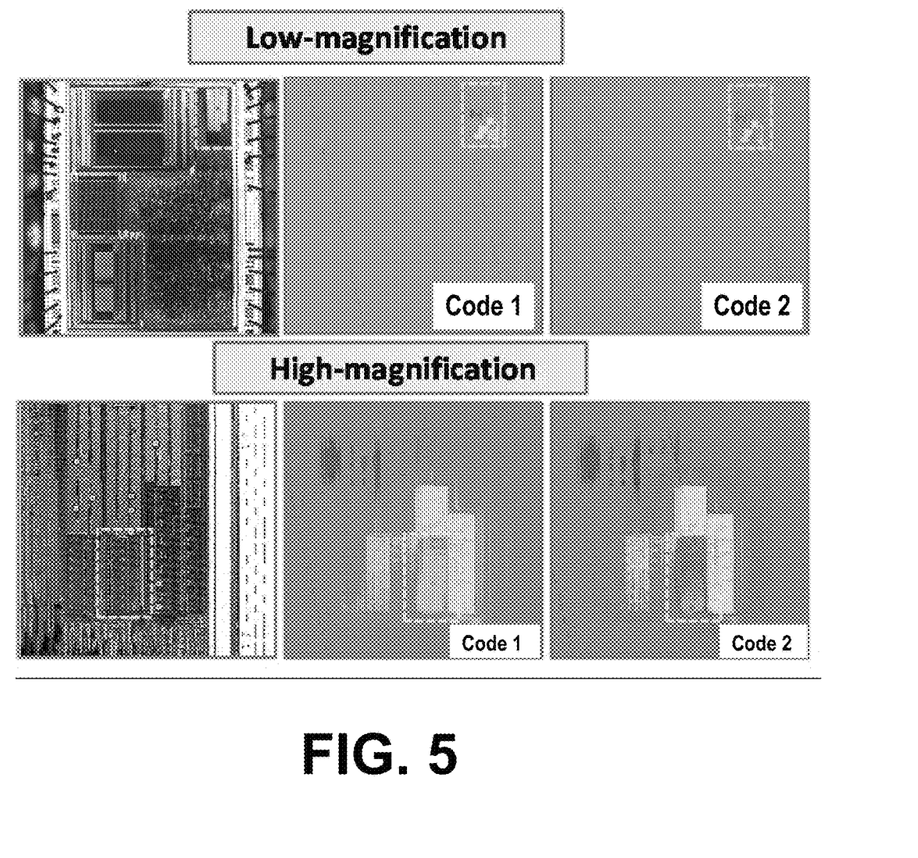
FIG. 5 provides low-magnification (top row) and high-magnification (bottom row) laser-induced PSA amplitude images of the Code-1 microcontroller (left-hand image of each pair) and Code-2 microcontroller (right-hand image of each pair) of FIG. 4. At left are a low-magnification and a high-magnification optical image of the Code-1 microcontroller. The laser-induced PSA amplitude images were taken using the frequency bin corresponding to the peak labeled "F1" in FIG. 4.

Thus FIG. 5, for example, shows the laser-induced amplitude images at the peak labeled F1 in FIG. 4. At left, the figure shows an optical image of the Code-1 microcontroller at low magnification (upper image) and at high magnification (lower image). To the right of the optical images is the laser-induced amplitude image of the Code-1 microcontroller at low magnification (upper image) and at high magnification (lower image). At the extreme right, the figure shows the laser-induced amplitude image of the Code-2 microcontroller at low magnification (upper image) and at high magnification (lower image).

Figure 6:
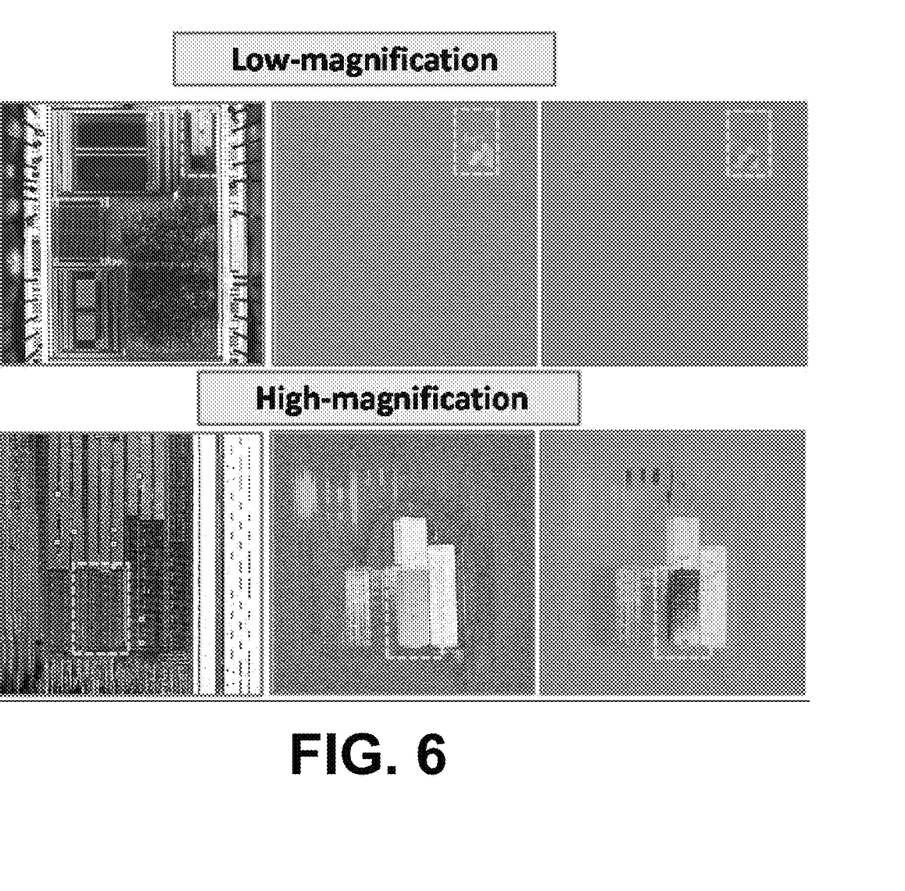
FIG. 6 provides low-magnification (top row) and high-magnification (bottom row) laser-induced PSA amplitude images of the Code-1 microcontroller (left-hand image of each pair) and Code-2 microcontroller (right-hand image of each pair) of FIG. 4. At left are a low-magnification and a high-magnification optical image of the Code-1 microcontroller. The laser-induced PSA amplitude images were taken using the frequency bin corresponding to the peak labeled "F4" in FIG. 4.

Similarly, FIG. 6 shows the laser-induced amplitude images at the peak labeled F4 in FIG. 4. At left, the figure again shows an optical image of the Code-1 microcontroller at low magnification (upper image) and at high magnification (lower image). To the right of the optical images is the laser-induced amplitude image of the Code-1 microcontroller at low magnification (upper image) and at high magnification (lower image). At the extreme right, the figure shows the laser-induced amplitude image of the Code-2 microcontroller at low magnification (upper image) and at high magnification (lower image).

With further reference to FIGS. 5 and 6, the bright areas in the laser-induced amplitude images are regions where the amplitude of the frequency peak increased under laser stimulation, whereas the dark areas are regions where the amplitude of the frequency peak decreased under laser stimulation. The areas where there were no changes in amplitude are shown in neutral grey. In both figures, the main area of differences between the Code-1 and Code-2 samples is highlighted by dashed rectangular boxes added to the high-magnification images.

Figure 7:
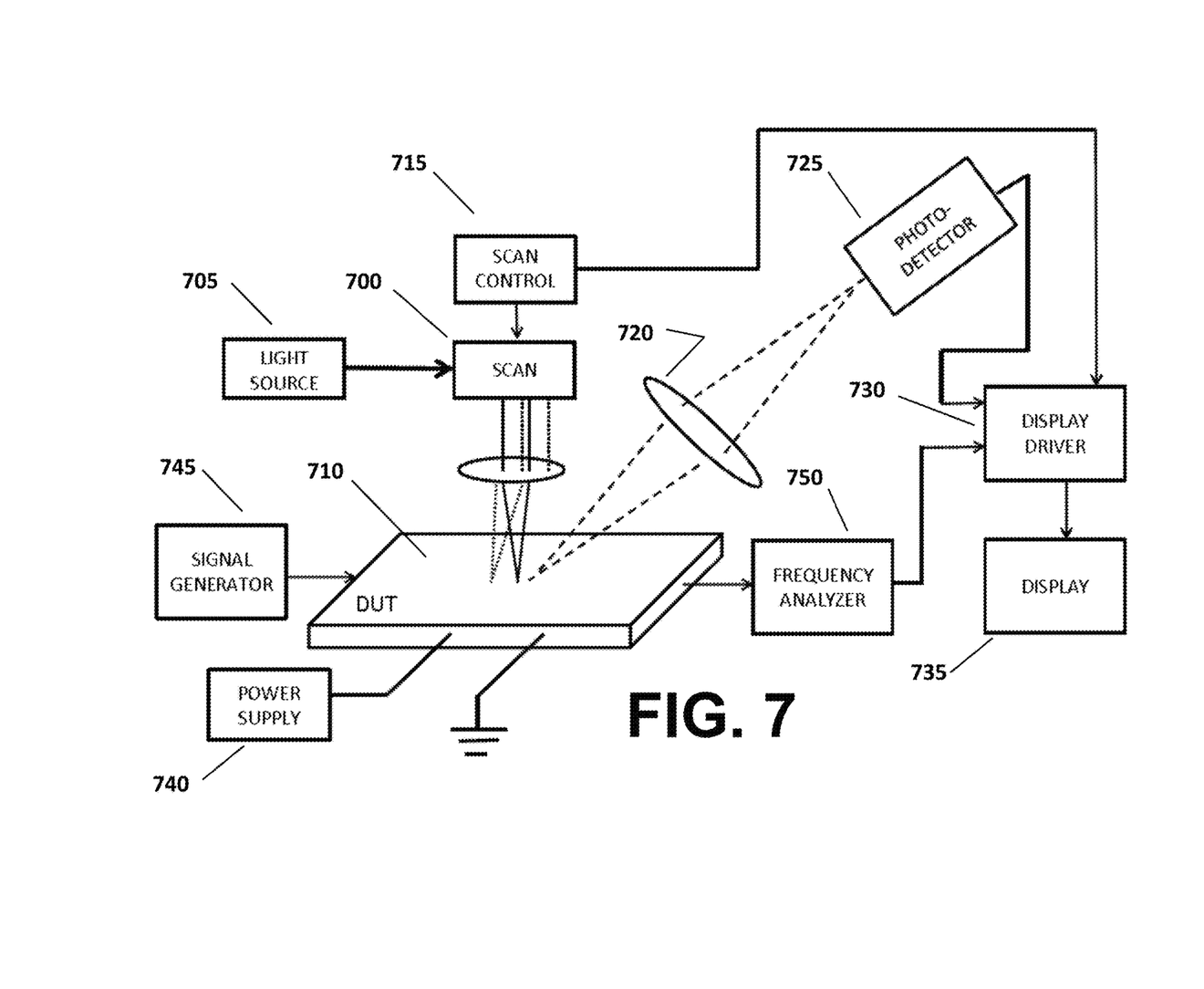
FIG. 7 is a notional block diagram of a system that scans a device under test to provide a scanned optical image and also an optically induced PSA amplitude image of the device.

FIG. 7 is a notional block diagram of an imaging system in which a scanning optical system 700 scans a spot of light from laser or other light source 705 over the surface of DUT 710 under the control of scan controller 715. Light scattered from the surface of the DUT during the scan is collected by lens system 720 and directed to photodetector 725. As in a scanning optical microscopy (SOM) system, the photodetector output is provided to display driver 730, which in response causes display device 735 to display an image of the DUT.

Concurrently with the optical scan, the DUT is powered from power supply 740, and signal generator 745 provides an on-normal or off-normal stimulus to selected pins of the DUT. An output from selected pins of the DUT is directed to spectrum analyzer 750. The spectrum analyzer is operated in "zero span" mode, so that it will provide a time-varying output that is limited to a single, designated frequency band. The video out port of the spectrum analyzer provides a voltage signal that is buffered in a frame buffer (included in display driver 730) and used to drive a PSA amplitude image on display device 735. Display driver 730 is desirably configured so that the SOM image and the PSA amplitude image can be displayed in superposition.

As those skilled in the art will recognize, the arrangement of FIG. 7 bears some resemblance to a LIVA imaging system. When LIVA is performed on an integrated circuit (IC), for example, the IC is run in a constant current mode. As a laser beam scans the IC, it causes changes in current consumption with are manifested as voltage variations on the supply line that are amplified in a band-pass filter amplifier and displayed.

PSA amplitude imaging differs from LIVA in several respects. In particular, a dynamic stimulus is required for PSA. The dynamic stimulus is typically periodic, so that a steady-state periodic response is evoked that can be monitored from spot to spot during the scan. Although periodic stimuli are typical, the use of non-periodic stimuli is also feasible and is not excluded. For example, pseudorandom noise could constitute a useful stimulus for some applications, if it is devised to have a power spectrum that is stationary over the dwell time of one spot in the scan.

The use of the spectrum analyzer is another feature that distinguishes PSA amplitude imaging from LIVA. The spectrum analyzer makes it possible to select, from among all possible frequency bins, those bins that give the best sensitivity for the specific application that is contemplated.

Figure 8:
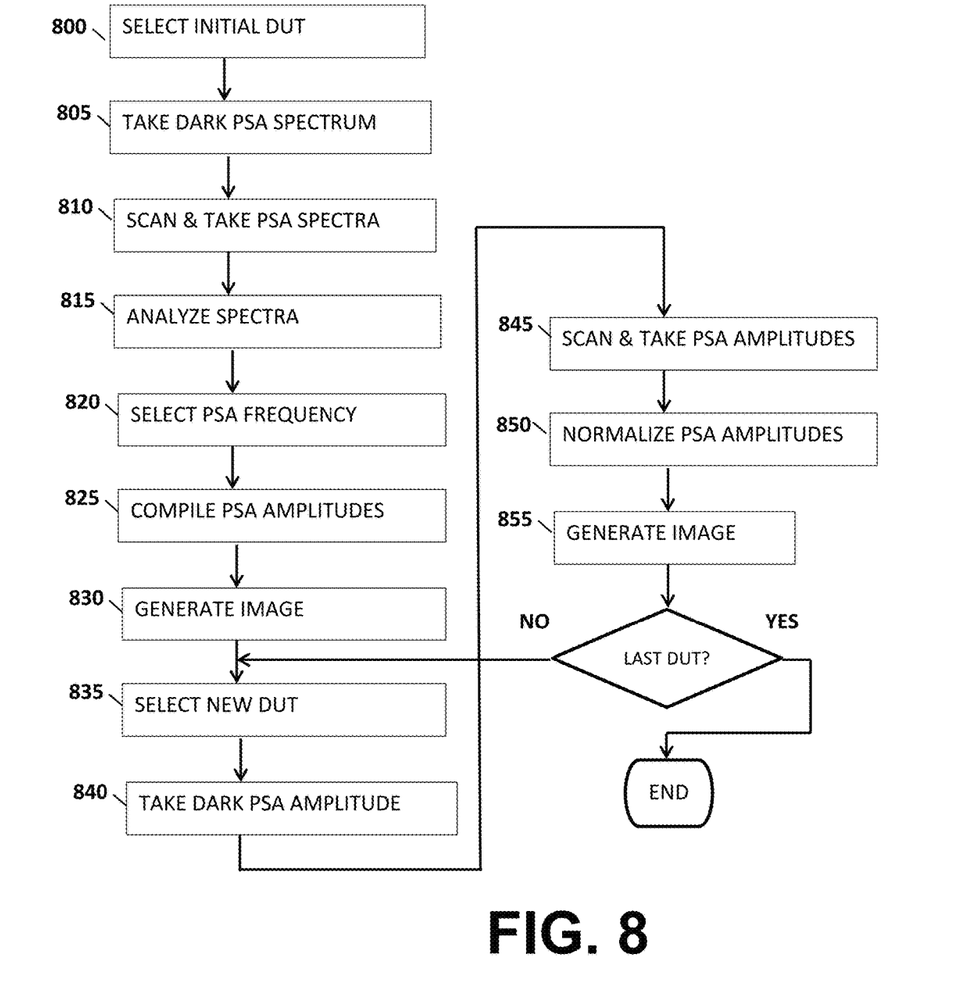
FIG. 8 is a flowchart illustrating a method for the PSA amplitude imaging of devices according to an illustrative example.

FIG. 8 provides a flowchart for beam-enhanced PSA amplitude imaging, in an illustrative example. At 800, an initial DUT is selected. At 805, a dark PSA spectrum is taken of the initial DUT. At 810, a scan, exemplarily a laser scan, is performed while taking a PSA spectrum at a plurality of grid points. The spatially resolved PSA spectra are normalized to the dark spectrum.

At 815, the spatially resolved spectra are analyzed to identify sensitive PSA frequencies as well as sensitive spatial locations on the DUT. It should be noted in this regard that for the purpose of identifying the sensitive frequencies, we have found that it is not necessary for the scan (at box 810) to cover the totality of grid points. In our experiments, we have found that five to ten selected areas are sufficient to identify the sensitive frequencies.

At 820, a PSA frequency to be used for imaging is selected. At 825, a set of spatially resolved PSA amplitudes is compiled by going to each grid point and pulling, from its PSA spectrum, the PSA amplitude at the selected frequency. At 830, each spatially resolved PSA amplitude is mapped to a respective pixel, and an image is generated.

At 835, a further DUT is selected. At 840, a dark PSA amplitude is taken at the selected PSA frequency. At 845, a set of spatially resolved PSA amplitudes is compiled by scanning the DUT and while scanning, obtaining the PSA amplitude at the selected PSA frequency at each grid point. At 850, the spatially resolved PSA amplitudes are normalized to the dark PSA amplitude. At 855, each normalized spatially resolved PSA amplitude is mapped to a respective pixel, and an image is generated. If there are further DUTs to be examined, the method returns to step 835.

In a variation of the technique described above, the PSA signal is taken from a contactless probe instead of from pins of the DUT. The contactless probe is used to perform the scan of the DUT. Hence in variations of that type, the scanning probe does not typically induce changes in the response of the device, although it still provides spatial resolution that can be used for imaging.

In an example, the contactless probe is a radio-frequency antenna. Antennas useful for this purpose have typical spatial resolutions of several millimeters. This is sufficient, for example, to pinpoint discrete circuit elements such as individual defective integrated circuits arrayed on a printed circuit board. In one possible methodology, an antenna probe having low directivity is used to sense the PSA response of a circuit board as a whole. If the PSA analysis indicates that there is an anomaly in the response of the board, a second antenna having high directivity can scan the board while taking spatially resolved PSA data that are used for imaging, e.g. as described above. In experimental trials, we have found that noise, such as a waveform taking random logical values, can serve as a useful dynamic stimulus for PSA in this context.

As noted above, we have found that using principal component analysis (PCA) in conjunction with PSA can lead to the generation of physically meaningful values that are mappable to displayable variables. Our investigations into the use of PCA for imaging were preceded by our discovery that when PCA is applied to PSA spectra, it can be effective in distinguishing between sample sets of devices drawn from different populations.

As PCA is well-known, its general character will be described only briefly here. In PCA, a data set is projected to a new coordinate system by computing the eigenvectors and eigenvalues of the covariance matrix of that data set. Covariance of two random variables (two dimensions) can be expressed as $$\text{cov}(x, y) = \sum_{i=1}^{N} \frac{(x_i - x_{mean})(y_i - y_{mean})}{N};$$

where $x_i$ and $y_i$ are the values of variables x and y for the $i^{th}$ sample in the data set. N is the number of samples in the data set. The quantities $x_{mean}$ and $y_{mean}$ are the mean values for all the N samples for variables x and y respectively. The covariance matrix for the data set with three random variables, for example, can be expressed as $$C = \begin{bmatrix} \text{cov}(x, x) & \text{cov}(x, y) & \text{cov}(x, z) \\ \text{cov}(y, x) & \text{cov}(y, y) & \text{cov}(y, z) \\ \text{cov}(z, x) & \text{cov}(z, y) & \text{cov}(z, z) \end{bmatrix}$$

The coy (x, x), coy (y, y) and coy (z, z) are just the values of variance for variables x, y, and z respectively. If there are n variables in the data set, the covariance matrix will have n×n dimensions.

After the eigenvectors and eigenvalues of the covariance matrix are calculated, the eigenvalues are then ranked; the eigenvector with the largest eigenvalue is the most significant principal component, Principal Component 1, (PC1) of the data set. The next significant principal component is Principal Component 2 (PC2) which has the second largest value of eigenvalue, followed by PC3, PC4, PC5, etc. In general, most of the variability of a data set with a large number of variables, such as those for PSA spectra (in which there may be hundreds of variables) can be accounted for by just three principal components (PC1, PC2, and PC3). The values of all variables for all samples in the data set can then be transformed into a new three-dimensional coordinate system using the three orthogonal eigenvectors (PC1, PC2 and PC3).

One advantage of PCA component analysis is that variability of a data set with a large number of variables can be visualized in a scatterplot of only three-dimensions, in which each data point represents one of the test samples. Another advantage is that it can be effective for detecting physical conditions within a DUT that are manifested at several different frequencies, but which are difficult to distinguish when only one frequency is considered.

Many details in the above discussion have been omitted for brevity, but at the peril of oversimplification. For a fuller account, the interested person is urged to consult any of the many standard treatments of PCA that are available.

We have applied PCA in the analysis of PSA spectra that we have measured on electronic devices of various kinds. The variables in a typical PSA spectrum for PCA analysis are 400-800 discrete spectral amplitude values, each value corresponding to a specific frequency bin. PCA can of course also be applied for spectra having fewer than 400 values or more than 800 values.

We have found that most of the variability in the data is already subsumed into the first few principal components. As a consequence, we can obtain useful and meaningful results even with a drastic reduction in the dimensionality of the data space. For example, a typical spectrum has amplitude values at 800 different frequency bins, but PCA with only the first three principal components will lead to a three-dimensional distribution plot that is easily visualized and that still yields useful information.

In some cases, as few as two principal components, or even a single principal component, may suffice. Of course, any number of principal components up to the number n of variables of the data set may be used, but more than six will not typically be desired because of diminishing returns due to the rapid fall-off in the variance after the first few principal components.

It should be stressed, however, that some principal components may be useful in detecting anomalies even if they are not within the set consisting of the first few leading principal components. Thus a useful set of three principal components might consist, for example, of PC1, PC2, and PC5 if PC5 has been found to help distinguish between good and bad devices or between different populations of devices.

In U.S. patent application Ser. No. 14/882,710, cited above, we described a visualization technique in which a vector of two or three principal component values represents a DUT when the vector is plotted as a point in a respectively two-dimensional or three-dimensional coordinate system. This approach makes it possible to display cluster plots of groups of DUTs. Any individuals or subgroups that diverge from a main grouping can be labeled as anomalous.

Figure 9:
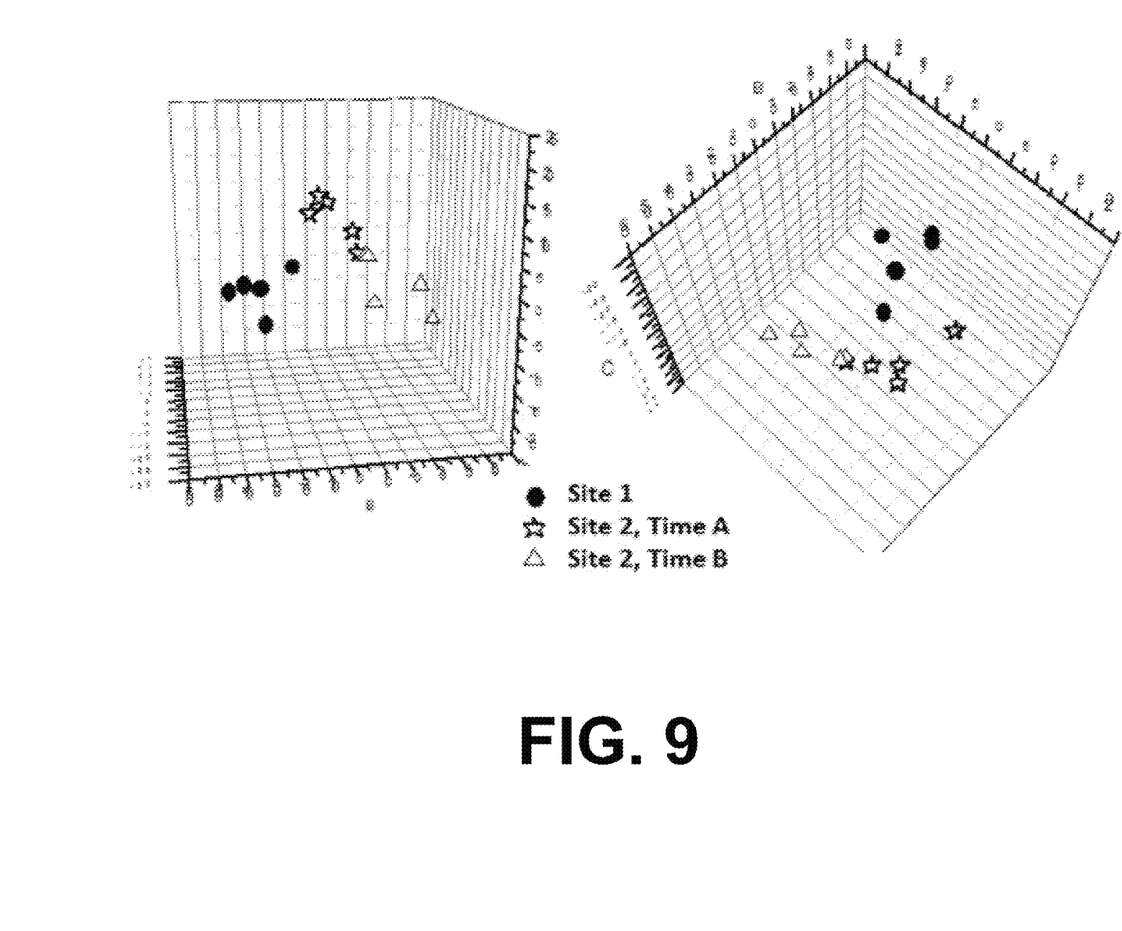
FIG. 9 provides three-dimensional PCA distribution plots visualized from three data sets of PSA spectra. The PCA distributions are visualized from two different perspectives. The PSA spectra were all taken on application-specific integrated circuits (ASICs) having the same design and made at the same foundry, but at different times or places.

FIG. 9 provides an illustrative example of cluster plots in a three-dimensional coordinate system. The data displayed in the figure were obtained from the PSA spectra of a group of application-specific integrated circuits (ASICs) having the same design and made at the same foundry, but at different times (Time A and Time B) or places (Site 1 and Site 2). Each of the plotted points represents a vector consisting of the first three principal components PC1, PC2, and PC3. The same plot is visualized in two different perspectives for greater clarity.

In the figure, the filled black circles represent one manufacturing site (Site 1), and the open stars and triangles represent a different manufacturing site (Site 2) of the same foundry. The open stars and triangles represent different manufacturing lots from the same manufacturing site, but made during two time periods (Time A and Time B) about six months apart. It will be seen that the data clusters from the two manufacturing sites are well separated from each other, and that there is partial separation with overlap between the clusters from the same site but different times.

Figure 10:
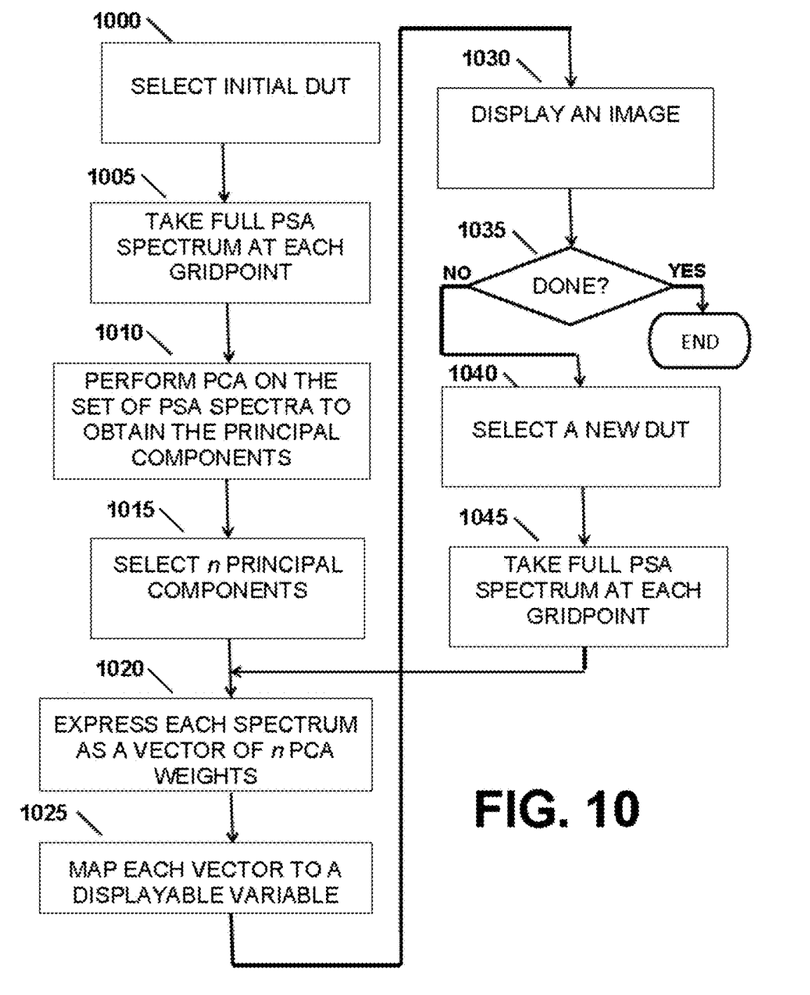
FIG. 10 is a flowchart illustrating an example of how PCA can be used to enhance our PSA-based visualization method.

FIG. 10 is a flowchart illustrating an example of how PCA can be used to enhance our PSA-based visualization method. In the example of FIG. 10, a representative device is selected first, for the purpose of obtaining the principal components and selecting the basis that will be used to characterize all spectra taken subsequently. After initialization using the first, representative device, further devices are screened using the selected basis to characterize their respective grid point-by-grid point spectra.

Accordingly, the DUT to be used for initialization is selected at box 1000. At box 1005, a PSA spectrum is taken at each grid point over a full range of frequency bins. A typical number of frequency bins is 800, although smaller or greater numbers are feasible and may be preferable depending on the application. At box 1010, a PCA is performed on the spectra taken at all of the grid points of the scan. This analysis identifies the principal components.

At box 1015, a basis of principal components is selected. There are n principal components in the basis. The value of n will typically be 3, although it may be as small as 1 or 2, and for some purposes values of 4 or more will also be useful.

Although the basis will typically consist of the first n principal components (e.g., PC1, PC2, and PC3), it will in some cases be advantageous to include one or more of the higher-numbered principal components. That will be true, for example, if a higher-numbered principal component is particularly sensitive to differences, i.e. differences between the stimulated responses of different DUTs, that are meant to be detected. Thus if n principal components in total are chosen for the basis, it will be advantageous in at least some cases if at least one of those n principal components is also one of the first n principal components, i.e., one of those principal components that maximally account for variation among the spectra.

It will be understood in this regard that the principal component analysis of box 1010 correlates spectra only across the scan of a single test sample device, but not across a population of test sample devices. Hence it will bring out image contrast among different spatial regions on the face of the DUT, but it will not contain any "training" for distinguishing DUTs from different populations. In at least some cases, training of that kind can be provided by concatenating, at each grid point, the PSA spectra of test devices from different populations. Alternatively, particular principal components may be manually selected based, for example, on the results of cluster-plot studies such as those described above.

With further reference to FIG. 10, at box 1020 the PSA spectrum taken at each grid point is expressed as a vector of length n. Each of the n components is a weight coefficient corresponding to a respective one of the principal components. The principal components may be regarded as coordinate axes in a high-dimensionality vector space, and the PSA spectra may be regarded as vectors in that space. In that view, each weight component represents the projection of the spectrum onto the corresponding coordinate axis.

At box 1025, each weight-coefficient vector is mapped to a displayable variable. For example, for n=3, each of the weights can be interpreted as a percentage of primary red, blue, or green, respectively, in an additive color scheme. At box 1030, the resulting image is displayed. For example, in the additive color scheme referred to above, each set of three percentages can determine the color of a respective pixel in the image.

Box 1035 of the figure indicates that the process of analyzing and imaging DUTs can continue for as long as there are DUTs to be screened. If there are remaining DUTs, the process continues to box 1040, where a new DUT is selected for screening. At box 1045, a PSA spectrum over the full range of frequency bins is taken at each grid point. As the initialization process has already defined the basis of principal components, the process continues at box 1020, where each of the spectra is expressed as a vector of n weights.

The PSA spectra are normalized prior to PCA, and prior to expressing the spectra in terms of the PCA weights. In some embodiments, the normalization is relative to dark PSA spectra, as explained above. In other embodiments, the normalization can be performed relative to the PSA spectrum of a representative or baseline device that is similarly under active scan.

In an example, an IC is scanned over a scan box of 128×128 pixels. The power spectrum is taken in 801 frequency bins over a span of 0 MHz to 80 MHz. The resulting matrix of raw data thus contains, 16,384 spectra, each having a length of 801 bins. PCA is applied to the raw data matrix to create a three-dimensional principal-component basis. Each spectrum is characterized by a triplet of weight coefficients, which are respectively assigned to a red, a blue, and a green color channel to define a color pixel.

In at least some cases, the interpretation of the resulting color image will be facilitated by cross-comparing a scan of a known good device with a scan of a device with a known defect. That is, the PSA spectra taken on the defective device are normalized to the corresponding spectra taken on the known good device in order to bring out the differences between the respective devices. The normalizations are carried out pixel-by-pixel. For this to be done correctly, the two scans must first be properly aligned to each other.

In an example of a useful alignment method, three pairs of points are designated. In each pair, one point belongs to the first device, and the other point belongs to the corresponding position on the second device. The three pairs are provided as input to an affine transformation, which creates an (x,y) offset for each pixel of one image that matches it with the corresponding pixel of the other image. Scanned optical images constructed from scattered light, as described above, are typically taken before or concurrently with the PSA images. These images are conveniently used for creating the point pairs used in the affine transformation.

After the two scans have been aligned, the normalization is performed as explained above. The normalized data matrix then undergoes PCA, and the resulting weights are used to create the color picture. A localized defect, if made visible by this procedure, will generally appear as a colored feature against a relatively featureless background. To confirm the location of the defect, the image can be superimposed on an aligned grey-scale optical image of the device.

Each of any number of subsequent DUTs can be screened for the same defect by taking its PSA scan, aligning the raw data to the reference device as explained above, normalizing the scan to the reference device, performing the PCA to generate a color image, and inspecting the color image for the telltale feature.

What is claimed is:

1. A method, comprising:
applying a stimulus waveform, using a signal generator, at least between two pins of a circuit;
applying a probe to a grid of multiple grid points, wherein each grid point is a spot on the circuit;
monitoring an electrical output produced by the circuit in response to the stimulus waveform for each of multiple grid points where the probe is applied;
performing a power spectrum analysis (PSA), to produce a power spectrum amplitude in each of one or more frequency bins, on the monitored output for each of the multiple grid points;
deriving a respective pixel value from the PSA for each of the multiple grid points;
constructing an image from the pixel values; and
displaying the image.

2. The method of claim 1, wherein:
the probe is a beam of electromagnetic radiation, an electron beam, or an ion beam,
applying the probe comprises impinging the beam onto the circuit, and
the output is monitored at least on two pins of the circuit.

3. The method of claim 2, wherein the probe is a beam of infrared, visible, or ultraviolet light.

4. The method of claim 2, wherein:
the method further comprises selecting a frequency bin for the PSA, and
the respective pixel values are derived from power-spectrum amplitudes in the selected frequency bin.

5. The method of claim 2, wherein:
the method further comprises performing a PSA on the monitored output without applying the probe, so as to obtain a dark PSA amplitude in each of the one or more frequency bins;
the respective pixel value for each of the multiple grid points is derived from a power-spectrum amplitude produced by the PSA in each of the one or more frequency bins; and
for each of the multiple grid points, the power-spectrum amplitude produced by the PSA in each of the one or more frequency bins is normalized to the dark PSA amplitude in a respective one of the one or more frequency bins before said power spectrum amplitude is used to derive a respective pixel value.

6. The method of claim 1, wherein:
at each of the multiple grid points, the PSA is performed over a plurality of frequency bins, thereby to produce a vector of power spectrum amplitudes;
the method further comprises performing a principal component analysis (PCA) on the vectors of power spectrum amplitudes, thereby to identify one or more principal components, wherein each of said one or more principal components can be assigned a principal component weight;
the method further comprises mapping each said vector to an n-tuple of principal component weights, wherein n equals 1, 2, 3, or 4; and
the respective pixel values are derived from the n-tuples.

7. The method of claim 6, wherein n=1 and the pixel values are displayed as gray-scale values.

8. The method of claim 6, wherein n=3 and the pixel values are displayed as color values.

9. The method of claim 6, wherein n=4, and the pixel values are displayed as a combination of color values and height values in a three-dimensional representation.

10. The method of claim 6, wherein:
the PCA is performed so as to identify the n principal components that maximally account for variability in the vectors over the multiplicity of grid points; and
the mapping of each said vector to an n-tuple of principal component weights is carried out such that at least one of the principal component weights in the mapped n-tuple is a weight for one of the n principal components that maximally account for variability in the vectors over the multiplicity of grid points.

11. The method of claim 10, wherein before performing the PCA, the vectors of power spectrum amplitudes at the respective grid points are normalized relative to a response of the circuit to the stimulus waveform absent application of the probe.

12. The method of claim 1, wherein the stimulus waveform is periodic.

13. The method of claim 1, wherein the stimulus waveform is non-periodic.

14. The method of claim 1, wherein the stimulus waveform is applied as an on-normal stimulus.

15. The method of claim 1, wherein the stimulus waveform is applied as an off-normal stimulus.

16. The method of claim 1, wherein the grid points correspond to locations on an integrated circuit that is scanned by the probe.

17. The method of claim 1, wherein at least some of the grid points correspond to discrete circuit elements on a circuit board that is scanned by the probe.

18. The method of claim 1, further comprising making a disposition of the circuit based on the displayed image.

19. A method, comprising:
applying a stimulus waveform, using a signal generator, at least between two pins of a circuit;
applying a probe to a grid of multiple grid points, wherein each grid point is a spot on the circuit;
monitoring a radio-frequency output produced by the circuit in response to the stimulus waveform for each of multiple grid points where the probe is applied;
performing a power spectrum analysis (PSA), to produce a power spectrum amplitude in each of one or more frequency bins, on the monitored output for each of the multiple grid points;
deriving a respective pixel value from the PSA for each of the multiple grid points;
constructing an image from the pixel values; and
displaying the image,
wherein the probe is used to sense the output produced by the circuit in response to the stimulus waveform, and wherein the monitoring of the circuit output comprises monitoring a signal from the probe.

20. The method of claim 19, wherein the probe is a radio-frequency antenna.

* * * * *